(12) United States Patent
Nakashima et al.

(10) Patent No.: US 6,388,311 B1
(45) Date of Patent: *May 14, 2002

(54) SEMICONDUCTOR DEVICE

(75) Inventors: Kaoru Nakashima; Chikaya Mimura; Seiichiro Sakata, all of Kitakyusyu (JP)

(73) Assignee: Mitsui High-Tec Incorporated, Kitakyushu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,318

(22) Filed: Dec. 6, 1999

(30) Foreign Application Priority Data

Feb. 26, 1999 (JP) .............................. 11-050567

(51) Int. Cl.[7] ............................. H01L 23/495
(52) U.S. Cl. .................. 257/676; 257/666; 257/787
(58) Field of Search ................. 257/676, 666, 257/670, 672, 787, 671, 692

(56) References Cited

U.S. PATENT DOCUMENTS

| | | | | |
|---|---|---|---|---|
| 4,943,843 A | * | 7/1990 | Okinaga et al. | 357/70 |
| 5,227,662 A | * | 7/1993 | Ohno et al. | 257/676 |
| 5,430,331 A | * | 7/1995 | Hamzehdoost et al. | 257/796 |
| 5,814,878 A | * | 9/1998 | Hirakawa et al. | 257/669 |
| 5,854,511 A | * | 12/1998 | Shin et al. | 257/713 |
| 5,886,397 A | * | 3/1999 | Ewer | 257/667 |
| 5,942,794 A | * | 8/1999 | Okumura et al. | 257/495 |
| 6,075,282 A | * | 6/2000 | Champagne | 257/675 |

* cited by examiner

Primary Examiner—Lincoln Donovan
Assistant Examiner—Kyung S. Lee
(74) Attorney, Agent, or Firm—Varndell & Varndell, PLLC

(57) ABSTRACT

A semiconductor device capable of preventing moisture from entering into a package and also capable of preventing peeling between a pad and the package from occurring.

The semiconductor device comprises grooves formed on a semiconductor element mounting surface of the pad to surround the semiconductor element, plated portions formed on only a ground bond area of the semiconductor element mounting surface of the pad, a thin portion formed on an entire peripheral edge portions on the back of the pad, and thin portions formed at portions which connect with the pad, on backs of support bars extending from the pad.

4 Claims, 5 Drawing Sheets

SEMICONDUCTOR DEVICE

BACKGROUND OF THE INVENTION

1. Field of the Invention

The present invention relates to a semiconductor device which is configured to expose the back of a semiconductor element mounting pad to the outside of a package.

2. Description of the Related Art

In order to favorably release heat and electromagnetic noise generated as semiconductor element B is made to have a large size and large capacity, and to achieve thinning of package P, semiconductor device A shown in FIG. 5 has pad C which mounts the semiconductor element B and which is down set and the back of the pad C is exposed to the outside of package P.

In the semiconductor device A, the semiconductor element B and leads L, L, . . . are connected by bonding wires W, and in order to use the pad C as a ground, the entire surface of the pad C is plated with a noble metal such as Ag (silver), and the semiconductor element B and the pad C are bonded by bonding wires (ground bonding wire) G for grounding.

Meantime, the aforesaid semiconductor device A has a disadvantage that moisture is easy to enter into it through boundary part V between the pad C and the package P because the pad C is exposed to the outside of the package P, and when moisture reaches a semiconductor element-mounting surface of the pad C and evaporated or expanded as the semiconductor device A is heated, a popcorn crack might be caused.

It also has a disadvantage that since the pad C of the semiconductor device A has its large area exposed to the outside of the package P, it is directly affected by heat when the semiconductor device A is exposed by a heat cycle of heating and cooling to cause a gap at the boundary part V between the pad C and the package P due to a difference in heat expansion rate, and moisture is allowed to enter through the gap.

Furthermore, there is a disadvantage that the noble metal-plated surface on the entire surface of the pad C is poor in intimate contact with the package (sealing resin) P as compared with a non-plated surface, so that when the semiconductor device A is exposed to a heat cycle, broad peeling is caused between the pad C and the package (sealing resin) P to break any of the bonding wires (ground bonding wire) G.

There is also a disadvantage that when epoxy resin-based adhesive agent F used to fix the semiconductor element B to the pad C is precipitated to the surface of the pad C due to heating to form a bleed layer, broad peeling is also caused between the pad C and the package (sealing resin) P to break any of the bonding wires (ground bonding wire) G.

In view of the aforesaid circumstances, it is an object of the present invention to provide a semiconductor device which can prevent moisture from entering the package and also can prevent peeling between the pad and the package from occurring.

SUMMARY OF THE INVENTION

The semiconductor device of claim 1 according to the present invention is a semiconductor device in which a back of a pad for mounting a semiconductor element is exposed to an outside of a package, comprising: grooves formed on a semiconductor element mounting surface of the pad to surround the semiconductor element; plated portions formed on only a ground bond area of the semiconductor element mounting surface of the pad; a thin portion formed on an entire peripheral edge portions on the back of the pad; and thin portions formed at portions, which connect with the pad, on backs of support bars extending from the pad.

By configuring as described above, an unexpected gap can be prevented from being formed at the boundary between the pad and the package, and a route of moisture at the boundary between the pad and the package becomes long, so that moisture can be prevented from entering into the semiconductor element-mounting surface of the pad, and a popcorn crack can be prevented from occurring.

And, by configuring as described above, an adhesive agent does not flow to expand to all the area of the semiconductor element-mounting surface of the pad, and plated portions having poor adhesion with the package are formed on only a minimum ground bond area. Therefore, extensive peeling between the package and the pad can be prevented, and bonding wires are prevented from being broken.

DESCRIPTION OF THE PREFERRED EMBODIMENTS

The present invention will be described in detail with reference to the accompanying drawings.

Figure 1A:
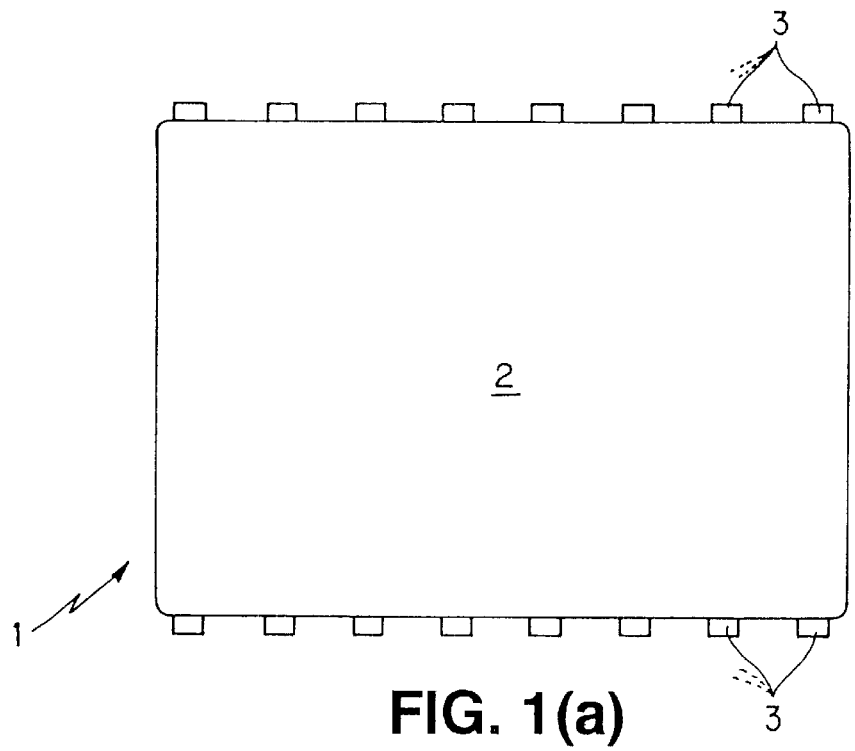
FIGS. 1(*a*) and 1(*b*) are plan diagrams showing a semiconductor device according to the present invention.
Figure 1B:
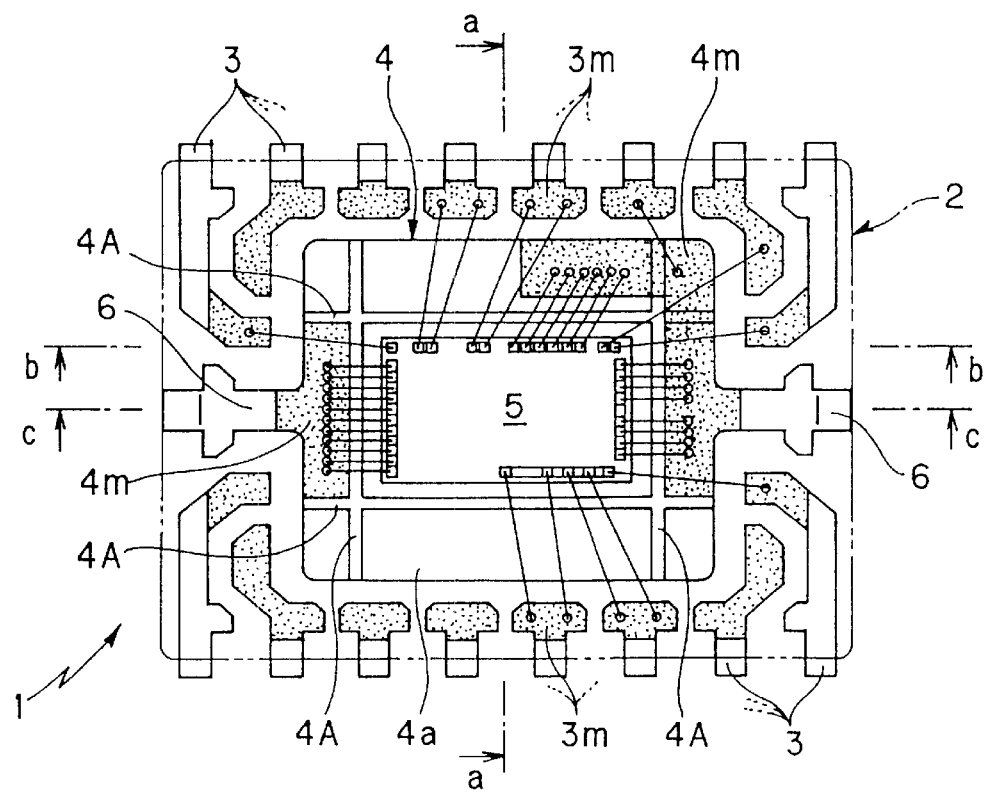
Figure 2A:
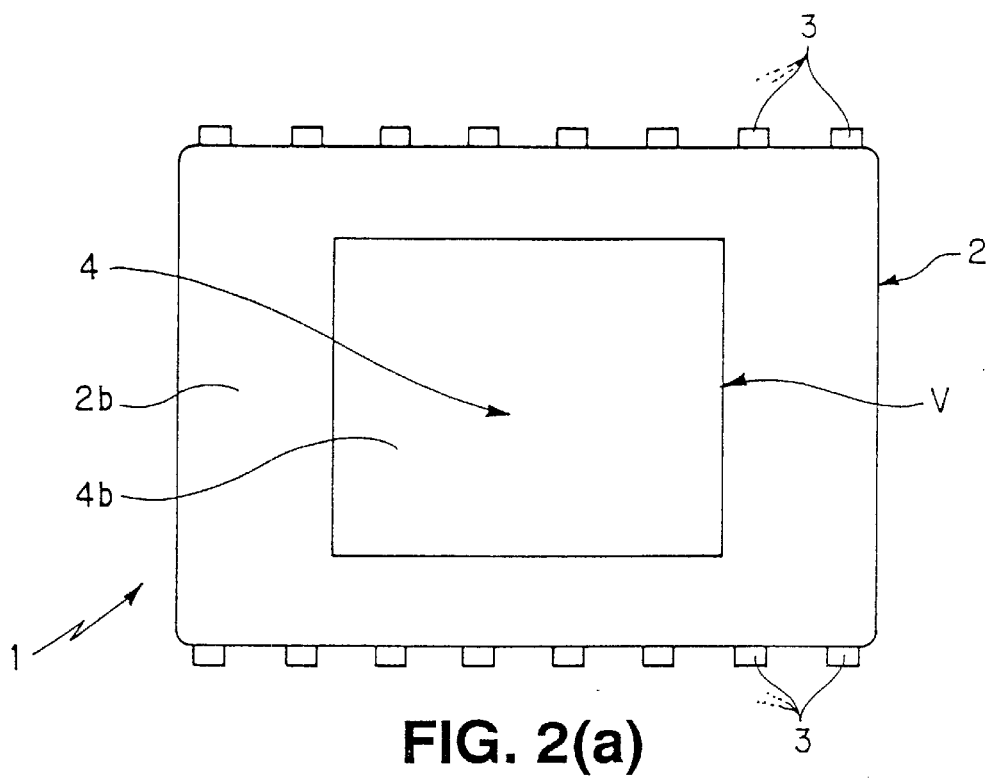
FIGS. 2(*a*) and 2(*b*) are bottom diagrams showing a semiconductor device according to the invention.
Figure 2B:
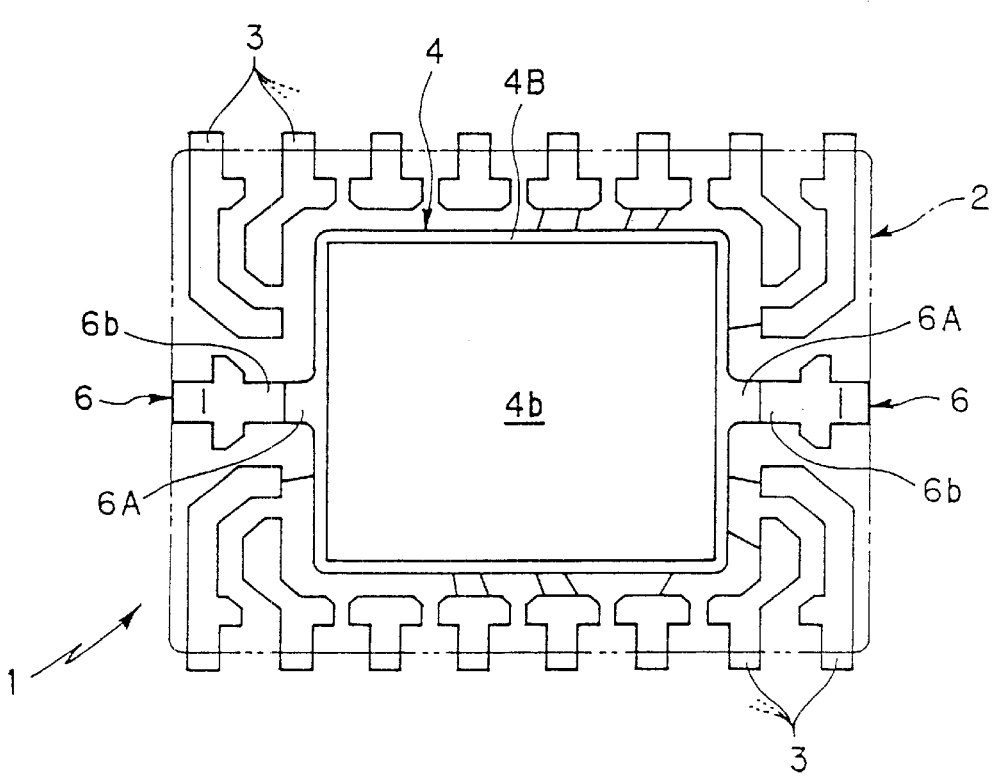
Figure 3A:
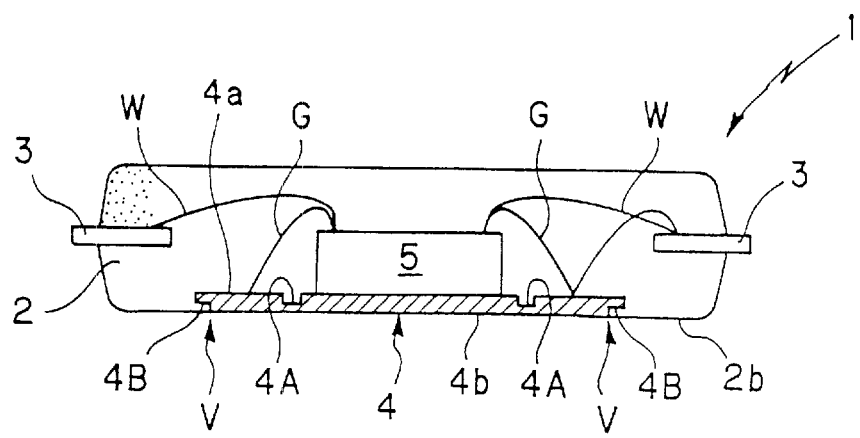
FIGS. 3(*a*), 3(*b*) and 3(*c*) are respectively sectional diagrams taken on lines a—a, b—b and c—c of FIG. 1(*b*)
Figure 3B:
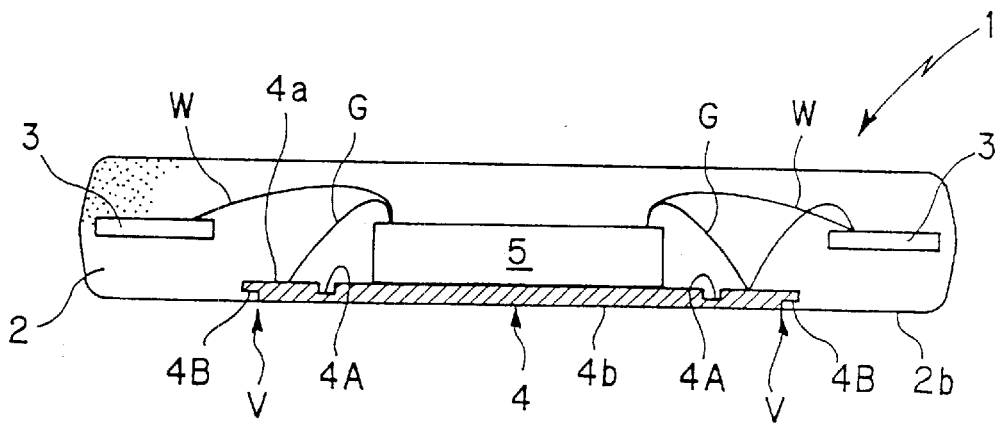
Figure 3C:
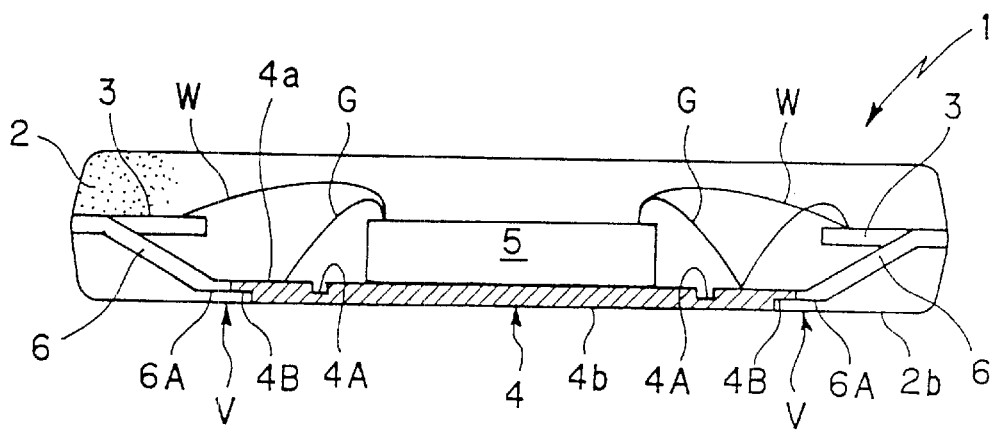

As shown in FIG. 1 through FIG. 3, semiconductor device 1 of the present invention is a DIL (dual inline) type semiconductor device which has a plurality of leads 3, 3, protruded from either side of package 2, and back 4*b* of pad 4 is exposed at bottom 2*b* of the package 2.

Semiconductor element 5 is mounted (adhered) at the center area of semiconductor element-mounting surface 4*a* of the pad 4 with an epoxy resin-based adhesive agent and electrically connected to the respective leads 3 (plated portions 3*m*) through bonding wires W.

Portions 4*m*, 4*m* plated with a noble metal such as Ag (silver) are formed on the semiconductor element-mounting surface 4*a* of the pad 4, and the semiconductor element 5 mounted on the pad 4 is electrically connected (ground bonded) to the respective plated portions 4*m*, 4*m* through bonding wires (ground bonding wires) G.

In this embodiment, particular leads 3 and the plated portions 4*m* of the pad 4 are also bonded (ground bonding) through the bonding wires.

The plated portions 4*m*, 4*m* are not formed on the entire area of the semiconductor element-mounting surface 4*a* of the pad 4 but on a part of the semiconductor element-mounting surface 4*a*, specifically on only a minimum ground bond area required for connecting the bonding wires G.

Grooves 4A, 4A, 4A, 4A are formed on the semiconductor element-mounting surface 4a of the pad 4 to surround the semiconductor element 5 mounted on the pad 4.

Stepped thin portion 4B is formed along the entire edge of the back 4b of the pad 4.

A pair of support bars 6, 6 extended from the pad 4 have thin portions 6A, 6A formed on their backs 6b used as bonding portions for connection with the pad 4, and the thin portions 6A are assimilative with the thin portion 4B.

The semiconductor device 1 described above is produced by the following steps.

A lead frame is shaped from a copper-based or ion-nickel-based material by etching.

At this time, the respective grooves 4A, 4A, . . . on the semiconductor element-mounting surface 4a of the pad 4 and the thin portion 4B on the back 4b of the pad 4 are also formed by etching.

The lead frame can also be formed by stamping by a press, and when the lead frame is formed by the press, the grooves 4A and the thin portion 4B of the pad 4 can also be formed by pressing such as coining at the same time.

After forming the lead frame, the plated portions 4m, 4m of a noble metal such as Ag (silver) are formed on the necessary area (ground bond area) of the semiconductor element-mounting surface 4a of the pad 4, and the plated portions 3m, 3m, . . . are formed on the necessary areas of the respective leads 3, 3, Then, the support bars 6, 6 of the lead frame are depressed to down set the pad 4 at a lower part.

At this time, the thin portions 6A, 6A of the support bars 6, 6 are also formed by coining by means of a press when the pad 4 is down set.

It is to be understood that the down set of the pad 4 and the forming of the thin portions 6A of the support bars 6 can be performed independently by a separate process.

The thin portions 6A of the support bars 6 can also be formed by etching instead of pressing.

The thin portions 6A of the support bars 6 and the thin portion 4B of the pad 4 are desirably set to have a depth of at least 40%, preferably 60% or more, of a thickness of a base material.

After down setting the pad 4, the semiconductor element 5 is mounted (adhered) on the semiconductor element-mounting surface 4a of the pad 4, the semiconductor element 5 and the respective leads 3, 3, . . . are mutually connected by the bonding wires W, and the semiconductor element 5 and the pad 4 are connected (ground bonding) by the bonding wires (ground bond wire) G.

With the back 4b of the pad 4 exposed, the package 2 is formed by molding with the sealing resin, the respective leads 3, 3, . . . , and the support bars 6, 6 are separated from the lead frame to complete the semiconductor device 1.

In the semiconductor device 1 configured as described above, the thin portion 4B of the pad 4 and the thin portions 6A of the support bars 6 are covered with the sealing resin of the package 2 as shown in FIG. 3, and an entering route of moisture at the boundary V between the pad 4 and the sealing resin becomes long, so that moisture can be prevented from entering the semiconductor element-mounting surface 4a of the pad 4.

When the semiconductor device 1 configured as described above is exposed to a heat cycle of heating and cooling, the grooves 4A, 4A, . . . formed on the pad 4 serve to absorb a stress applied to the pad 4 so to prevent the pad 4 from being deformed. Thus, an unexpected gap is prevented from being formed at the boundary V between the package (sealing resin) 2 and the pad 4, and moisture can be prevented from entering the semiconductor element-mounting surface 4a of the pad 4.

As described above, the semiconductor device 1 configured as described above can prevent moisture from entering the semiconductor element-mounting surface 4a of the pad 4, and a so-called popcorn crack can be prevented from occurring in the device 1.

In the semiconductor device 1 having the aforesaid structure, even when the adhesive agent fixing the semiconductor element 5 to the pad 4 is flown out by heating, it is caught by the grooves 4A, 4A, . . . formed on the semiconductor element-mounting surface 4a of the pad 4, so that the adhesive agent does not spread to fully cover the semiconductor element-mounting surface 4a. Thus, extensive peeling between the package (sealing resin) 2 and the pad 4 can be prevented.

Extensive peeling between the package (sealing resin) 2 and the pad 4 can also be prevented from occurring because the plated portions 4m, 4m having poor intimate contact with the package (sealing resin) 2 in the semiconductor device 1 having the aforesaid configuration are formed on only the minimum ground bond area of the semiconductor element-mounting surface 4a of the pad 4.

As described above, the semiconductor device 1 can prevent a problem that the bonding wires G are broken because the extensive peeling between the package (sealing resin) 2 and the pad 4 can be prevented.

Figure 4A:
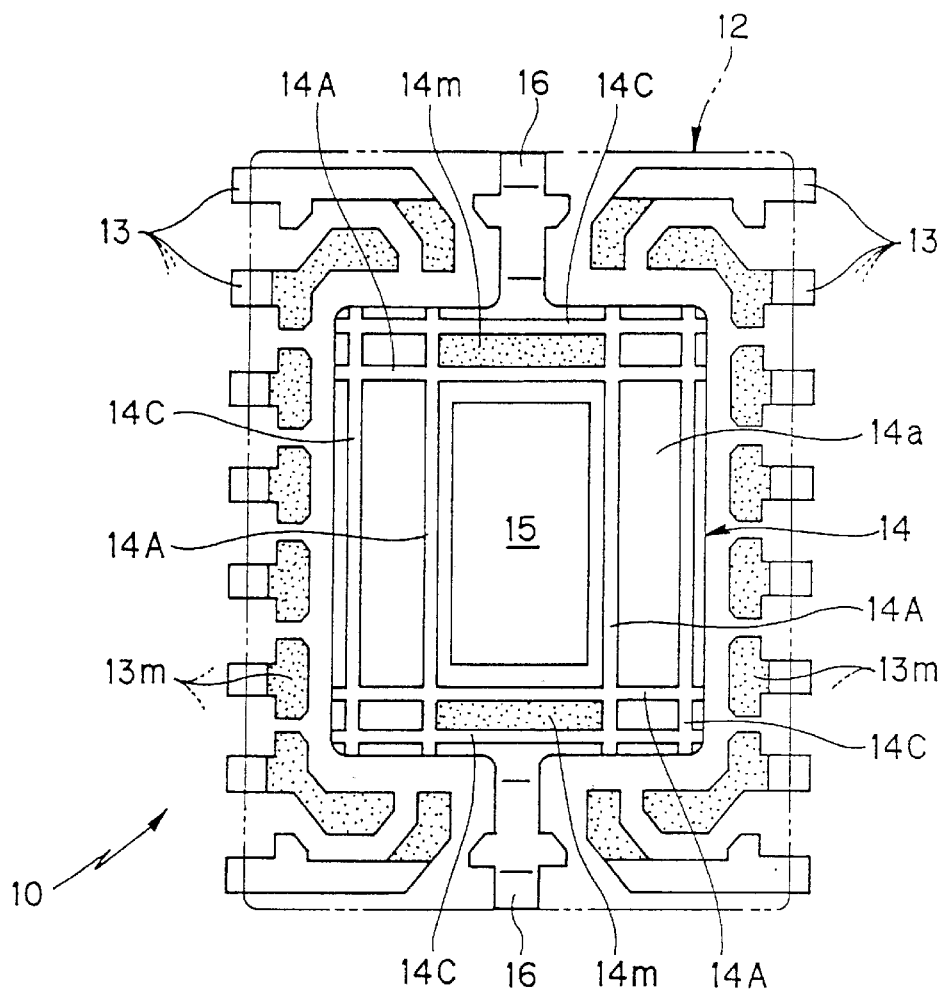
FIGS. 4(*a*) and 4(*b*) are a plan diagram and a side sectional diagram showing another embodiment of the semiconductor device according to the invention.
Figure 4B:
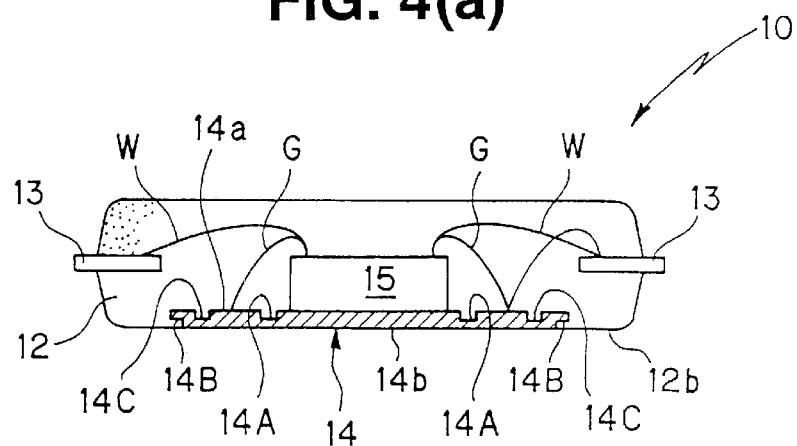
Figure 5A:
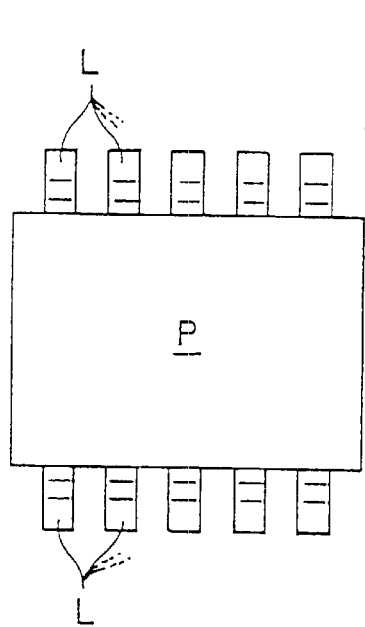
FIGS. 5(*a*), 5(*b*) and 5(*c*) are a plan diagram, a bottom diagram and a side sectional diagram showing a conventional semiconductor device.
Figure 5B:
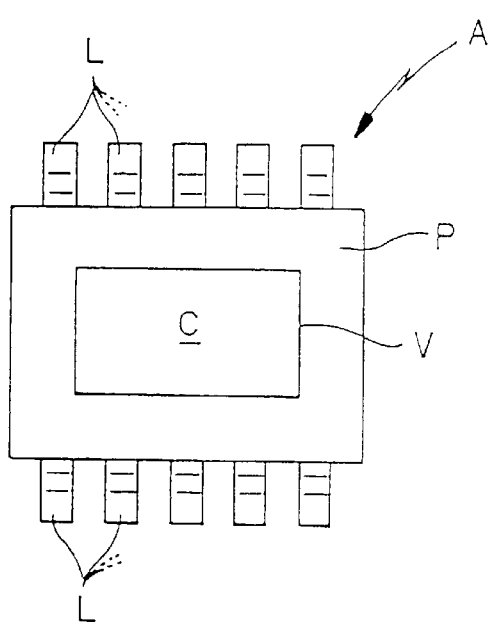
Figure 5C:
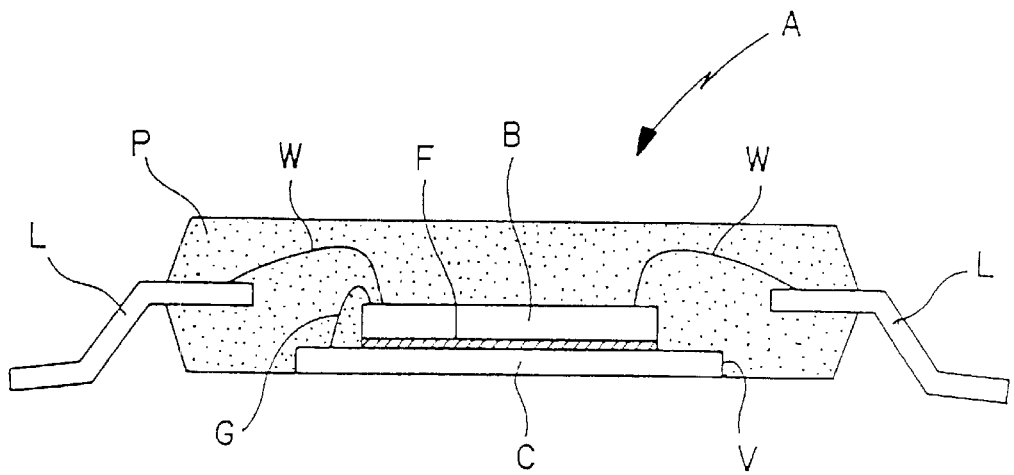

FIG. 4 shows another embodiment of the semiconductor device according to the present invention, wherein grooves 14A, 14A, 14A, 14A are formed on pad 14 of semiconductor device 10 to surround semiconductor element 15 mounted on the pad 14, and outside grooves 14C, 14C, 14C, 14C are also formed along the edge of the pad 14.

The configuration of the aforesaid semiconductor device 10 is the same as that of the semiconductor device 1 shown in FIG. 1 through FIG. 3 excepting the outside grooves 14C, 14C, . . . of the pad 14. Therefore, the reference numerals used in FIG. 1 through FIG. 3 are also used in FIG. 4 with 10 added to indicate the elements having the same functions as those of the semiconductor device 1, and detailed descriptions of the same elements are omitted.

In the semiconductor device 10 configured as described above, the outside grooves 14C, 14C, . . . are formed on semiconductor element-mounting surface 14a of the pad 14, so that an entering route of moisture from back 14b of the pad 14 becomes longer than in the semiconductor device shown in FIG. 1 through FIG. 3, and moisture is caught by the outside grooves 14C, 14C, . . . and can be prevented from entering into the semiconductor element-mounting surface 14a of the pad 14.

When exposed to a heat cycle of heating and cooling, the grooves 14A, 14A, . . . and the outside grooves 14C, 14C, . . . of the pad 14 serve to absorb a stress applied to the pad 14 so to suppress the pad 14 from being deformed. Thus, an unexpected gap can be prevented from being formed at a boundary between package 12 and the pad 14, and moisture can be prevented from entering the semiconductor element-mounting surface 14a of the pad 14.

According to the semiconductor device 10 configured as described above, a so-called popcorn crack can be prevented from occurring because moisture can be prevented from entering the semiconductor element-mounting surface 14a of the pad 14.

Even if the adhesive agent used to fix the semiconductor element 15 to the pad 14 is flown out due to heating, it can be caught by the grooves 14A, 14A, . . . formed on the pad 14, so that the adhesive agent is not expanded to the entire area of the semiconductor element-mounting surface 14a, and extensive peeling between the package 12 and the pad 14 can be prevented.

Plated portions 14m, 14m having poor intimate contact with the package 12 are formed on only the minimum ground bond area of the semiconductor element-mounting surface 14a of the pad 14, so that extensive peeling between the package 12 and the pad 14 can be prevented from occurring.

Thus, according to the semiconductor device 10 configured as described above, a problem that bonding wires G are broken can be prevented from occurring because the extensive peeling between the package 12 and the pad 14 is prevented.

To examine the reliability of the semiconductor device, there is a test that the semiconductor device is placed in a chamber at a high humidity to damp the package and subjected to a thermal stress by an IR (infrared rays) reflow device to check the occurrence of a crack and peeling in the package.

And, it is apparent that the semiconductor device 1 and the semiconductor device 10 in the respective embodiments described above are easy to pass the reliability evaluation test.

In the aforesaid embodiments (the semiconductor device 1 and the semiconductor device 10), the DIL type semiconductor device with the leads expanded in two directions from the package was exemplified. But, the invention is not limited to it and can also be applied effectively to a semiconductor device with the leads expanded in one or four directions from the package and a surface-mount type semiconductor device such as SMT (surface-mounted device).

What is claimed is:

1. A semiconductor device in which a back of a pad for mounting a semiconductor element is exposed to an outside of a package, comprising:

grooves formed on a semiconductor element mounting surface of the pad by deforming the semiconductor element mounting surface to surround the semiconductor element;

plated portions formed only on a ground bond area formed in a part of an area, which is located outside the grooves surrounding the semiconductor element, of the semiconductor element mounting surface of the pad;

a thin portion formed on an entire peripheral edge portion on the back of the pad; and thin portions formed at portions, which connect with the pad, on backs of support bars extending from the pad.

2. The semiconductor device according to claim 1 wherein the grooves formed on the semiconductor element mounting surface of the pad to surround the semiconductor element are provided in plural numbers respectively along the edges of the pad with spaces therebetween.

3. A semiconductor device in which a back of a pad for mounting a semiconductor element is exposed to an outside of a package, comprising:

grooves formed within a semiconductor element mounting surface of the pad and surrounding the semiconductor element, the grooves remaining open for absorbing stress and preventing the pad from deforming;

plated portions formed only on a ground bond area and in an area of the semiconductor element mounting surface of the pad that is located outside the grooves surrounding the semiconductor element;

a thin portion formed on an entire peripheral edge portion on the back of the pad; and thin portions formed at portions, which connect with the pad, on backs of support bars extending from the pad.

4. The semiconductor device according to claim 3, wherein the grooves formed within a semiconductor element mounting surface of the pad and surrounding the semiconductor element are provided in plural numbers respectively along edges of the pad with spaces therebetween.

* * * * *